(12) United States Patent
Cordatos et al.

(10) Patent No.: US 10,794,507 B2
(45) Date of Patent: Oct. 6, 2020

(54) FRANGIBLE FLUOROPOLYMER COATING

(71) Applicant: Hamilton Sundstrand Corporation, Charlotte, NC (US)

(72) Inventors: Haralambos Cordatos, Colchester, CT (US); Lev Alexander Prociw, Johnston, IA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/474,088

(22) Filed: Mar. 30, 2017

(65) Prior Publication Data

US 2018/0283569 A1     Oct. 4, 2018

(51) Int. Cl.
*F16K 25/04*     (2006.01)
*F16K 3/24*      (2006.01)
(Continued)

(52) U.S. Cl.
CPC ............ *F16K 25/005* (2013.01); *C23C 16/22* (2013.01); *F02C 7/232* (2013.01); *F16K 3/24* (2013.01);
(Continued)

(58) Field of Classification Search
CPC ..... F16K 3/22; F16K 3/24; F16K 3/36; F16K 11/07; F16K 11/0708; F16K 25/0005;
(Continued)

(56) References Cited

U.S. PATENT DOCUMENTS

| | | |
|---|---|---|
| 5,888,591 A | 3/1999 | Gleason et al. |
| 6,153,269 A | 11/2000 | Gleason et al. |
| (Continued) | | |

FOREIGN PATENT DOCUMENTS

| | | | |
|---|---|---|---|
| DE | 102005054132 A1 * | 5/2007 | ......... F02M 51/0639 |
| DE | 102005054132 A1 * | 5/2007 | ......... F02M 21/0296 |
| EP | 1760293 | 3/2007 | |

OTHER PUBLICATIONS

Gleason, K.K., Pryce Lewis, H.G., Chan, K., Lau, K.K.S., Mau, Y. (2005). Polymer nanocoatings by initiated chemical vapor deposition (iCVD). NSTI-Nanotech 2005. vol. 2, 2005.
(Continued)

*Primary Examiner* — Hailey K. Do
(74) *Attorney, Agent, or Firm* — Carlson, Gaskey & Olds, P.C.

(57) ABSTRACT

A fuel system includes a fuel passage for conveying a hydrocarbon fuel. The hydrocarbon fuel is reactive with oxygen to form carbonaceous deposit. A device is disposed in the fuel passage such as to be exposed to the hydrocarbon fuel. The device includes first and second surfaces that are spaced from each other by a clearance gap into which the hydrocarbon fuel can infiltrate. The first and second surfaces are in sliding motion with respect to each other when the device is in operation. A frangible fluoropolymer coating is disposed on at least one of the first or second surfaces along
(Continued)

the clearance gap. The coating is subject to the carbonaceous deposit adhering thereon. The coating is configured to allow portions to release by shearing off with the carbonaceous deposit under stress from the sliding motion to uncover a newly exposed face of the coating.

12 Claims, 4 Drawing Sheets

(51) Int. Cl.
- *F16K 25/00* (2006.01)
- *F02C 7/232* (2006.01)
- *C23C 16/22* (2006.01)
- *C09K 3/10* (2006.01)

(52) U.S. Cl.
CPC ............ *F16K 25/04* (2013.01); *C09K 3/1009* (2013.01); *F05D 2220/32* (2013.01); *F05D 2230/314* (2013.01); *F05D 2230/90* (2013.01); *F05D 2300/432* (2013.01); *F05D 2300/611* (2013.01)

(58) Field of Classification Search
CPC ............ F16K 25/04; Y10T 137/86694; Y10T 137/86767; Y10T 137/86791; Y10T 137/86678; Y10T 137/86887; Y10T 137/7767; Y10T 137/5421; C09K 3/1009; C09K 13/08; C09K 2200/0637; C09K 2205/24

See application file for complete search history.

(56) References Cited

U.S. PATENT DOCUMENTS

| | | | |
|---|---|---|---|
| 7,703,475 B2 * | 4/2010 | Rojanskiy | F16K 11/0712 137/375 |
| 8,524,816 B2 * | 9/2013 | Badyrka | C09D 175/04 524/147 |
| 8,900,663 B2 * | 12/2014 | Handy | B05D 1/34 427/249.1 |
| 2008/0203346 A1 | 8/2008 | Shu | |
| 2010/0269504 A1 | 10/2010 | Gage et al. | |
| 2014/0216584 A1 * | 8/2014 | Husveg | F16K 3/24 137/808 |
| 2015/0198241 A1 * | 7/2015 | Barngrover | F16H 61/0251 137/1 |
| 2015/0369133 A1 | 12/2015 | Bogue et al. | |
| 2017/0138489 A1 * | 5/2017 | Winkler | F16K 11/0716 |

OTHER PUBLICATIONS

European Search Report for European Patent Application No. 18164425 completed Aug. 15, 2018.

* cited by examiner

FRANGIBLE FLUOROPOLYMER COATING

BACKGROUND

Hydrocarbon fuels may pick up oxygen from the environment. The oxygen dissolves in the fuel and can potentially promote fuel reactions that form carbonaceous deposits, sometimes referred to as coking deposits or varnish. Fuel systems can include a fuel deoxygenator device to remove dissolved oxygen and thus reduce the potential for forming the deposits, however, some oxygen may remain and form deposits.

SUMMARY

A fuel system according to an example of the present disclosure includes a fuel passage for conveying a hydrocarbon fuel. The hydrocarbon fuel is reactive with oxygen to form carbonaceous deposit. A device is disposed in the fuel passage such as to be exposed to the hydrocarbon fuel. The device has first and second surfaces spaced from each other by a clearance gap into which the hydrocarbon fuel can infiltrate. The first and second surfaces are in sliding motion with respect to each other when the device is in operation. A frangible fluoropolymer coating is disposed on at least one of the first or second surfaces along the clearance gap. The frangible fluoropolymer coating is subject to the carbonaceous deposit adhering thereon. The frangible fluoropolymer coating is configured to allow portions of the frangible fluoropolymer coating to release from a balance of the frangible fluoropolymer coating with the carbonaceous deposit under stress applied thereto by the sliding motion to uncover a newly exposed face of the frangible fluoropolymer coating.

In a further embodiment of any of the foregoing embodiments, the frangible fluoropolymer coating is disposed on the first and second surfaces.

In a further embodiment of any of the foregoing embodiments, the clearance gap is about 10 micrometers or less.

In a further embodiment of any of the foregoing embodiments, the frangible fluoropolymer coating has a coating thickness of about 2 micrometers or less.

In a further embodiment of any of the foregoing embodiments, the frangible fluoropolymer coating is on a moving one of the first and second surfaces. The other of the first or second surfaces are static.

In a further embodiment of any of the foregoing embodiments, the frangible fluoropolymer coating is substantially pure fluoropolymer.

In a further embodiment of any of the foregoing embodiments, the frangible fluoropolymer coating is polytetrafluoroethylene.

In a further embodiment of any of the foregoing embodiments, the frangible fluoropolymer coating includes nanoparticles of fluoropolymer that have a maximum size of less than 100 nanometers.

In a further embodiment of any of the foregoing embodiments, the frangible fluoropolymer coating is substantially pure fluoropolymer.

In a further embodiment of any of the foregoing embodiments, the frangible fluoropolymer coating is polytetrafluoroethylene.

In a further embodiment of any of the foregoing embodiments, the device is a valve that has a valve body with a bore and a valve member disposed for movement in the bore, and the first surface is in the bore and the second surface is on the valve member.

A valve according to an example of the present disclosure includes a valve body that has a bore with a bore surface for receiving a hydrocarbon fuel that is reactive with oxygen to form carbonaceous deposit. A valve member is disposed in the bore and spaced from the bore surface by a clearance gap into which the hydrocarbon fuel can infiltrate. The valve member is moveable in the bore. The valve member has a valve member surface in sliding motion with respect to the bore surface when the valve member moves. A frangible fluoropolymer coating is disposed on at least one of the bore surface or the valve member surface along the clearance gap. The frangible fluoropolymer coating is subject to the carbonaceous deposit adhering thereon. The frangible fluoropolymer coating is configured to allow portions of the frangible fluoropolymer coating to release from a balance of the frangible fluoropolymer coating with the carbonaceous deposit under stress applied thereto by the sliding motion to uncover a newly exposed face of the frangible fluoropolymer coating.

In a further embodiment of any of the foregoing embodiments, the frangible fluoropolymer coating is disposed on the bore surface and the valve member surface.

In a further embodiment of any of the foregoing embodiments, the frangible fluoropolymer coating is on the valve member surface.

In a further embodiment of any of the foregoing embodiments, the frangible fluoropolymer coating is substantially pure fluoropolymer.

In a further embodiment of any of the foregoing embodiments, the frangible fluoropolymer coating is polytetrafluoroethylene.

In a further embodiment of any of the foregoing embodiments, the frangible fluoropolymer coating includes nanoparticles of fluoropolymer that have a maximum size of less than 100 nanometers.

In a further embodiment of any of the foregoing embodiments, the frangible fluoropolymer coating is substantially pure fluoropolymer.

In a further embodiment of any of the foregoing embodiments, the frangible fluoropolymer coating is polytetrafluoroethylene.

A method of extending an operational life of a fuel system device having surfaces that undergo relative motion at times according to an example of the present disclosure includes depositing a frangible fluoropolymer coating on at least one of the surfaces using initiated chemical vapor deposition. The frangible fluoropolymer coating is configured to allow portions of the frangible fluoropolymer coating to release from a balance of the frangible fluoropolymer coating with a carbonaceous deposit under stress applied thereto by the relative motion to uncover a newly exposed face of the frangible fluoropolymer coating.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
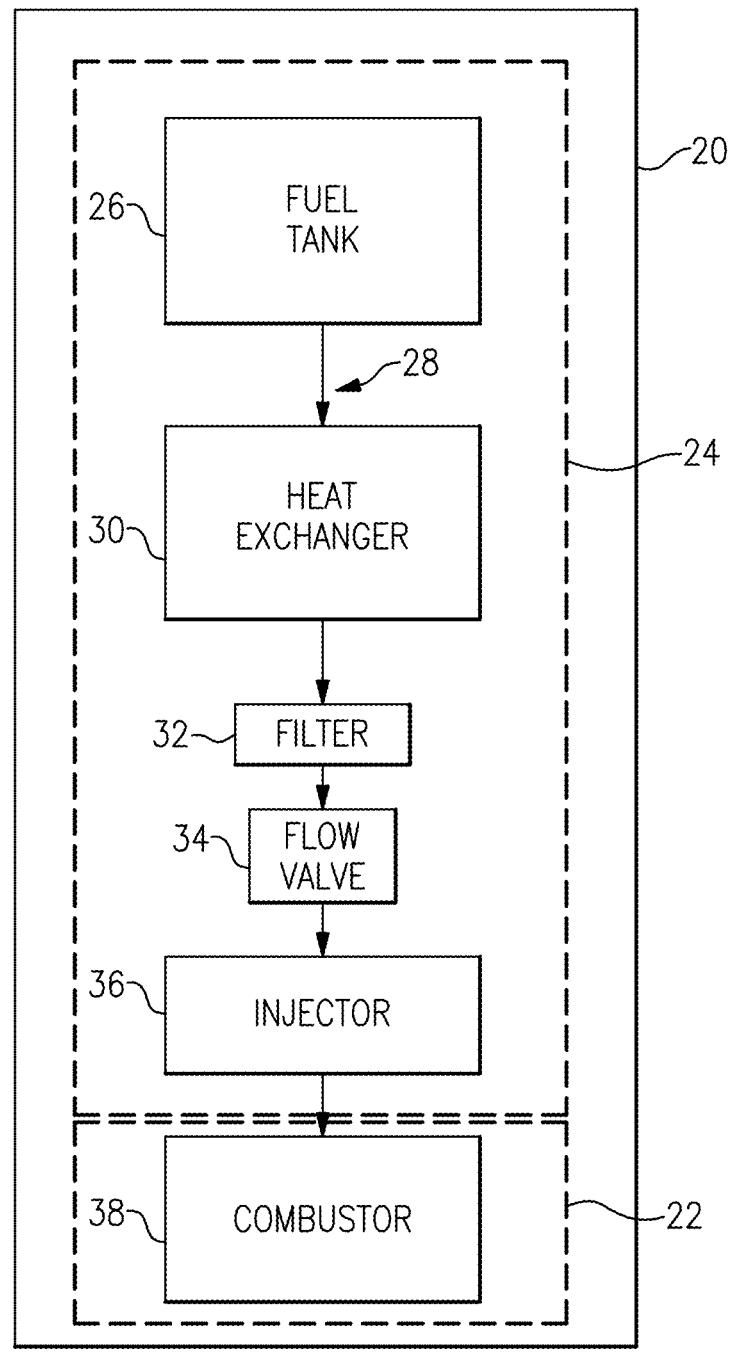
FIG. 1 illustrates an example fuel system.

FIG. 1 illustrates a representation of an aircraft 20 that has an engine 22, such as a gas turbine engine, and a fuel system 24 that is operable to deliver hydrocarbon fuel to the engine 22. The hydrocarbon fuel can vary, but typical hydrocarbon fuels may include diesel fuel, Jet A and Jet A-1 (ASTM D 1655), or JP-8 (MIL-DTL-83133). Such hydrocarbon fuels can contain dissolved oxygen that may react with hydrocarbons to form carbonaceous deposits, such as coke or varnish, on components in the fuel system 24. In particular, carbonaceous deposit between closely fitting moving components has the potential to damage and/or seize the moving components. In this regard, as will be described below, the fuel system 24 includes a specialized sacrificial coating that permits such deposits to shear off with part of the coating and thereby reduce the potential for damage and seizing.

As shown, the fuel system 24 in this example generally includes a fuel tank 26 and a fuel passage 28 that extends from the fuel tank 26 and into the engine 22. In this example, there are several components disposed in the fuel passage 28 to serve various functions in delivering the fuel to the engine 22. The components include a heat exchanger 30 for preheating the fuel, a filter 32 for removing foreign particles from the fuel, a flow valve (device) 34 for modulating fuel flow, and an injector 36 for delivering the fuel into a combustor 38 in the engine 22. As will be appreciated, the aircraft 20, engine 22, and fuel system 24 may include additional components related to the operation thereof, which are generally known and thus not described herein.

Figure 2A:
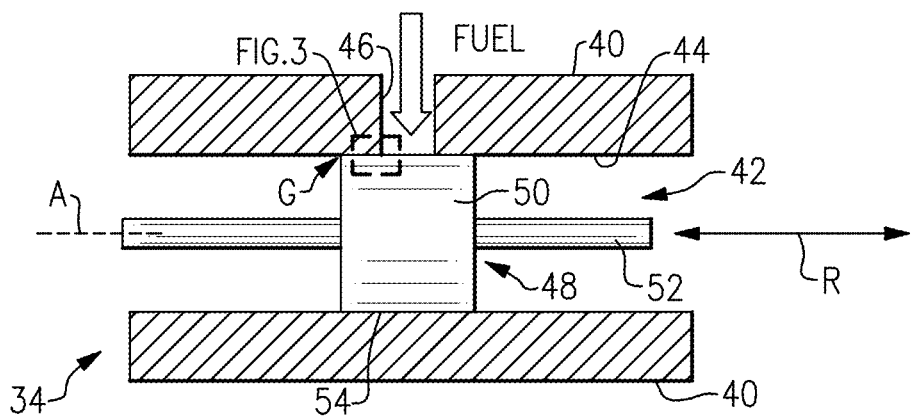
FIG. 2A illustrates a flow valve in the fuel system of FIG. 1, in a closed position.
Figure 2B:
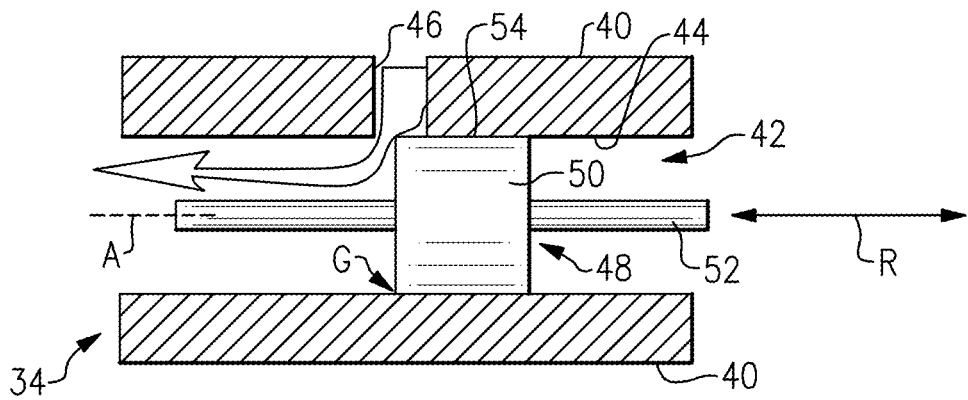
FIG. 2B illustrates the flow valve of FIG. 2A in an open position.

A representative portion of the flow valve 34 of the fuel system 24 is shown in FIGS. 2A and 2B. The flow valve 34 is an example implementation of a frangible fluoropolymer coating; however, it is to be appreciated that such a coating may additionally or alternatively be used on other types of fuel valves (e.g., injector type valves) or components in the fuel system 24 which have moving parts that are exposed to the fuel.

In this example, the flow valve 34 includes a valve body 40 that has a bore 42. The bore 42 includes a bore (or first) surface 44. There is an inlet 46 in the valve body 40 that opens into the bore 42. Although the inlet 46 serves to permit inflow of fuel, it is to be understood that in modified designs inlets and outlets are relative to the flow in the particular design.

The flow valve 34 further includes a valve member 48 disposed in the bore 42. The valve member 48 is moveable along axis A in the bore 42. In this example, the valve member 48 is a piston 50 connected with a shaft 52. The piston 50 has a valve member (or second) surface 54, which here is the outer surface of the piston 50. An actuator (not shown) may move the shaft back and forth axially, as represented at arrow R, to move piston 50 back and forth in the bore 42.

The valve member 48 is moveable with respect to the valve body 40, which is static. The valve member 48 moves axially to open and close the inlet 46. The valve member 48 is shown in a closed position in FIG. 2A and in an open position in FIG. 2B. In the closed position the valve member 48 blocks flow from the inlet 46 into the bore 42. In the open position the valve member 48 permits flow through the inlet 46 into the bore 42, where the fuel then continues to flow on to the injector 36.

Figure 3:
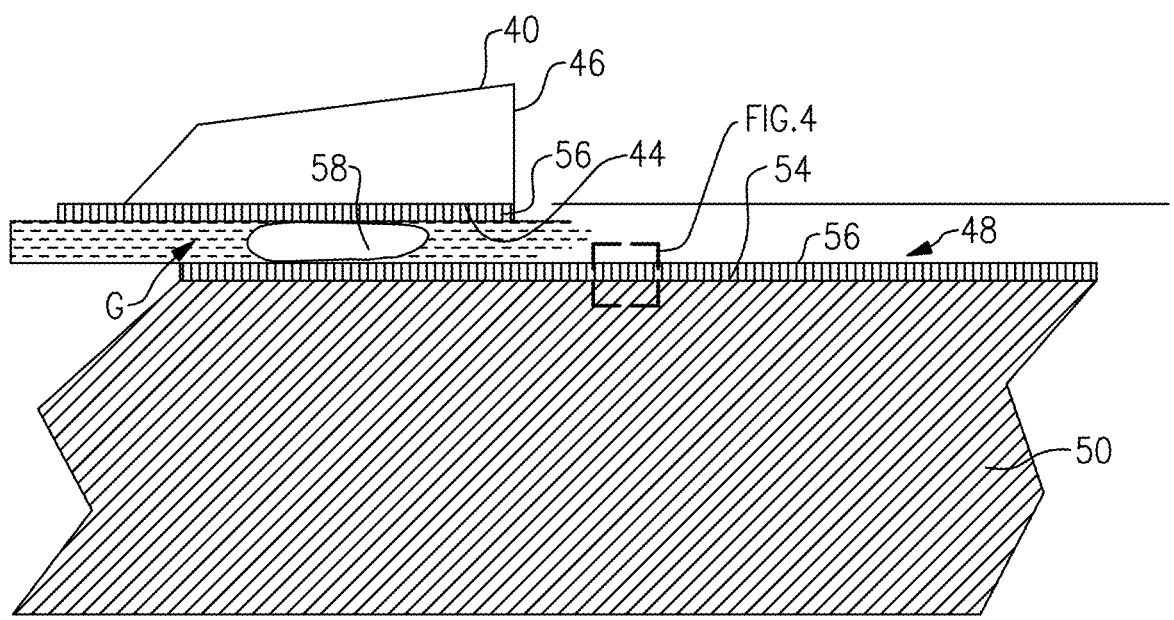
FIG. 3 illustrates a magnified view of a portion of the flow valve of FIG. 2A.

Referring also to the magnified view in FIG. 3, the valve member 48 is smaller than the diameter of the bore 42 so that there is a clearance gap (G) there between which allows the valve member 48 to slide within the bore 42. The bore surface 44 and the valve member surface 54 are thus in sliding motion with respect to each other when the flow valve 34 is in operation (i.e., the valve member is moving). The clearance gap will typically be approximately 10 micrometers or less, although the size may vary with movement of the piston 50. A frangible fluoropolymer coating 56 ("coating 56") is disposed on at least one of the bore surface 44 or the valve member surface 54 along the clearance gap. In this example the coating 56 is on both surfaces 44/54 for greater effectiveness. Alternatively, the coating 56 may be provided on only one of the surfaces 44 or 54.

The coating 56 may be about 2 micrometers or less in thickness, but may be 1 micrometer or less to maintain more of the clearance gap. The coating 56 is formed of a fluoropolymer. A fluoropolymer is a polymer that has a carbon chain backbone with fluorine-containing side groups. For example, the fluoropolymer is, but is not limited to, polytetrafluoroethylene. In one further example, the fluoropolymer or polytetrafluoroethylene is substantially pure such that the coating 56 consists only of the fluoropolymer and unintended impurities. The fluoropolymer provides some resistance to adherence of carbonaceous deposits on the bore 42 and valve member 48, although some carbonaceous deposits can still adhere to the coating 56. For instance, a powder-deposited polytetrafluoroethylene coating can reduce adherence, but likely not enough to warrant the additional cost of the coating.

Although the clearance gap is small, the hydrocarbon fuel can infiltrate into the clearance gap. In particular, in the type of environment in the engine 20, there may be residual hydrocarbon fuel left in the clearance gap when the engine 20 is shut off. At shut off, the engine 20 may be hot and residual heat may be conducted from the engine 20 into the flow valve 34. The conducted heat may increase the temperature of the residual hydrocarbon fuel in the clearance gap and cause carbonaceous deposits to form, shown at 58. In this shut off state, when the fuel is not moving in the clearance gap, the carbonaceous deposit 58 can adhere to the coating 56. However, the coating 56 has a frangible structure that permits a portion of the coating to shear off under the carbonaceous deposit 58 to shed the deposit 58. As will be described in further detail below, the coating 56 is configured such that a portion is released without the full thickness of the coating 56 being released. This may occur multiple times before the full thickness is released.

Figure 4A:
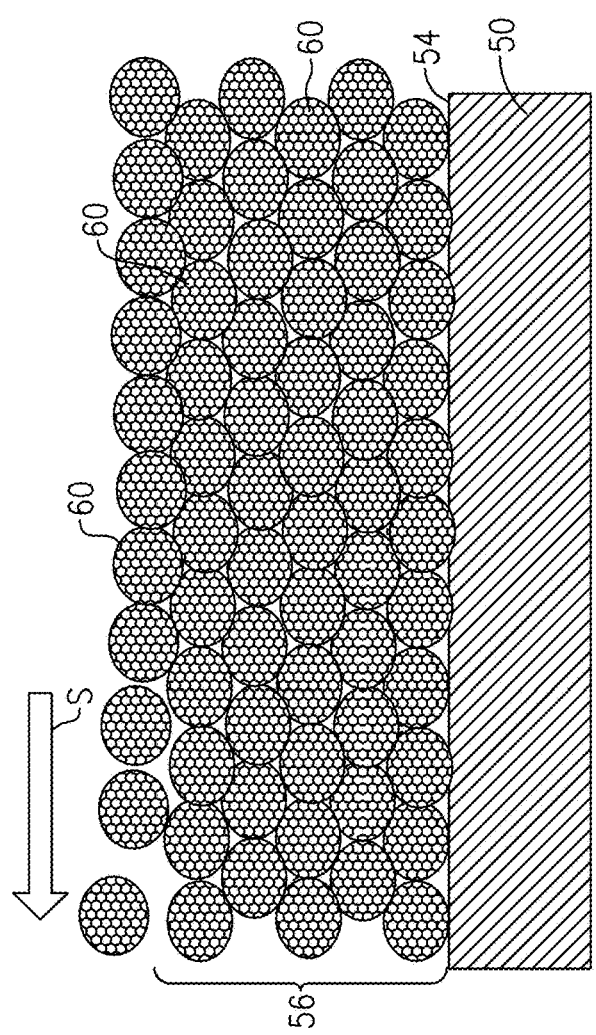
FIG. 4A illustrates a magnified view of a portion of a frangible fluoropolymer coating on the flow valve of FIG. 3.
Figure 4B:
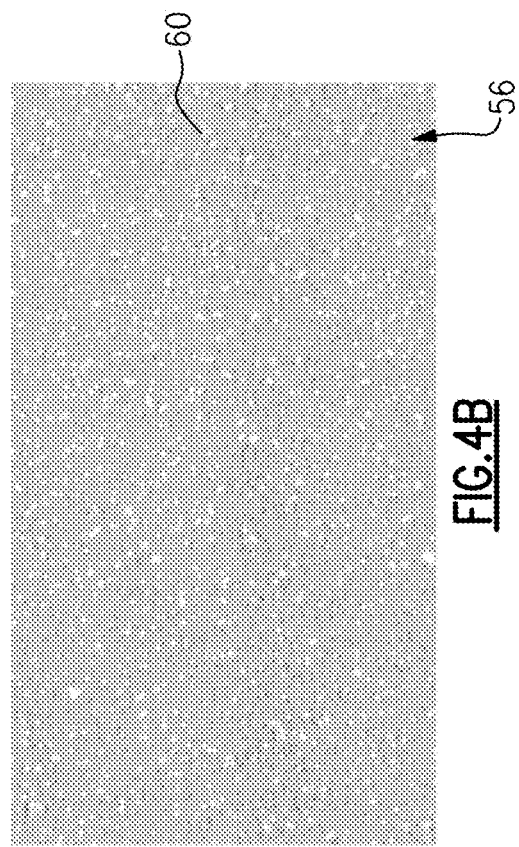
FIG. 4B illustrates a micrograph of the coating.

FIG. 4A shows a sectioned view of the coating 56, and FIG. 4B shows a micrograph of the coating 56 under high magnification. The coating 56 is formed of nano-particles 60 of fluoropolymer that have a maximum size of less than 100 nanometers. As an example, the nano-particles 60 are discrete domains or regions that are visibly distinguishable from each other at high magnification. The nano-particles 60 are generally spherical in shape, but it is also possible that a fraction of them can have alternative shapes, such as platelets with various aspect ratios, depending on the vapor deposition conditions.

The nano-particles 60 are weakly bonded to each other such that the coating 56 has low cohesive strength. Under the shear stress of the sliding motion, represented at arrow S, the nano-particles 60 can shear off. When the carbonaceous deposit 58 (see FIG. 5A) adheres to the coating 56, the shear stress on the deposit 58 concentrates the stress on a localized portion of the coating 56 underneath the deposit 58. This causes the portion of the coating 56 to break off and shed the deposit 58 to reduce the potential that the deposit 58 damages or seizes the flow valve 34.

Figure 5A:
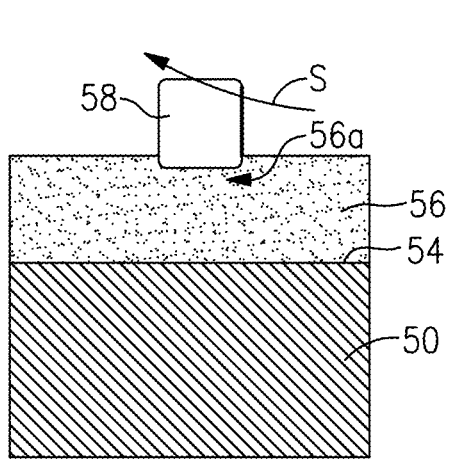
FIGS. 5A and 5B illustrate a deposit shedding from a frangible fluoropolymer coating.
Figure 5B:
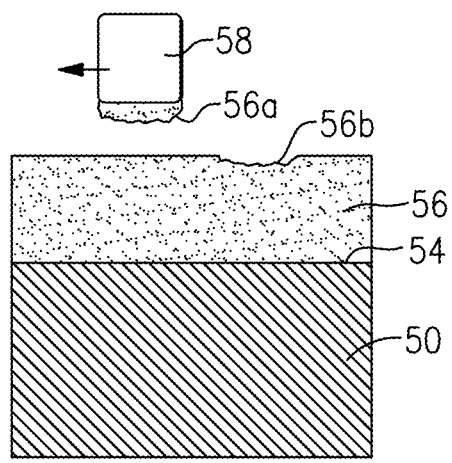

An example of this shear shedding is depicted in FIGS. 5A and 5B. Although the coating 56 is shown on the piston 50, it will be appreciated that the example is also representative of the coating 56 on the bore 42. In FIG. 5A the deposit 58 is adhered to the coating 56. Upon shearing due to motion between the surfaces 44/54, a layer 56a under the deposit 58 shears off as shown in FIG. 5B, thereby releasing the deposit 58 into the flow of fuel. The shearing off leaves a newly exposed face 56b on the coating 56. Over time, as additional deposits adhere and shed from the coating 56, the coating 56 may be depleted down to the surface 54 (or surface 44 if on the bore 42). Thus, the coating 56 may not, in some cases, last throughout the useful life of the flow valve 34. Rather, the coating 56 may serve to provide temporary mitigation of deposits to extend durability of the flow valve 34, in comparison to no coating 56.

The frangible structure and nano-particles 60 of the coating 56 can be fabricated by initiated chemical vapor deposition (iCVD) of the fluoropolymer. The iCVD process is especially suited to deposit the fluoropolymer in a thin, uniform thickness, with the desired nano-particle structure. As will be appreciated by those of skill in the art, however, there may be some fluoropolymer chemistries that are not amenable to deposition by iCVD.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A fuel system comprising:
a fuel passage for conveying a hydrocarbon fuel, the hydrocarbon fuel being reactive with oxygen to form carbonaceous deposit; and
a device disposed in the fuel passage such as to be exposed to the hydrocarbon fuel, the device including,
first and second surfaces spaced from each other by a clearance gap into which the hydrocarbon fuel can infiltrate, the first and second surfaces being in sliding motion with respect to each other when the device is in operation, and
a frangible fluoropolymer coating disposed on at least one of the first or second surfaces along the clearance gap, the frangible fluoropolymer coating being substantially pure fluoropolymer and including nano-particles of fluoropolymer that have a maximum size of less than 100 nanometers, the frangible fluoropolymer coating being subject to the carbonaceous deposit adhering thereon, the frangible fluoropolymer coating being configured to allow portions of the frangible fluoropolymer coating to shear off along interfaces of the nano-particles from a balance of the frangible fluoropolymer coating with the carbonaceous deposit under stress applied thereto by the sliding motion to uncover a newly exposed face of the frangible fluoropolymer coating.

2. The fuel system as recited in claim 1, wherein the frangible fluoropolymer coating is disposed on the first and second surfaces.

3. The fuel system as recited in claim 1, wherein the frangible fluoropolymer coating is on a moving one of the first and second surfaces, the other of the first or second surfaces being static.

4. The fuel system as recited in claim 1, wherein the device is a valve that has a valve body with a bore and a valve member disposed for movement in the bore, and the first surface is in the bore and the second surface is on the valve member.

5. The fuel system as recited in claim 1, wherein the nano-particles have a spherical shape.

6. The fuel system as recited in claim 1, wherein the nano-particles have a platelet shape.

7. The fuel system as recited in claim 1, wherein the clearance gap is about 10 micrometers or less.

8. The fuel system as recited in claim 7, wherein the frangible fluoropolymer coating has a coating thickness of about 2 micrometers or less.

9. A valve comprising:
a valve body including a bore having a bore surface for receiving a hydrocarbon fuel that is reactive with oxygen to form carbonaceous deposit;
a valve member disposed in the bore and spaced from the bore surface by a clearance gap into which the hydrocarbon fuel can infiltrate, the valve member being moveable in the bore, the valve member having a valve member surface in sliding motion with respect to the bore surface when the valve member moves; and
a frangible fluoropolymer coating disposed on at least one of the bore surface or the valve member surface along the clearance gap, the frangible fluoropolymer coating being substantially pure fluoropolymer and including nano-particles of fluoropolymer that have a maximum size of less than 100 nanometers, the frangible fluoropolymer coating being subject to the carbonaceous deposit adhering thereon, the frangible fluoropolymer coating being configured to allow portions of the frangible fluoropolymer coating to shear off along interfaces of the nano-particles from a balance of the frangible fluoropolymer coating with the carbonaceous deposit under stress applied thereto by the sliding motion to uncover a newly exposed face of the frangible fluoropolymer coating.

10. The valve as recited in claim 9, wherein the frangible fluoropolymer coating is disposed on the bore surface and the valve member surface.

11. The valve as recited in claim 9, wherein the frangible fluoropolymer coating is on the valve member surface.

12. A method of extending an operational life of a fuel system device having surfaces that undergo relative motion at times, the method comprising:
depositing a frangible fluoropolymer coating on at least one of the surfaces using initiated chemical vapor deposition, the frangible fluoropolymer coating being substantially pure fluoropolymer and including nano-particles of fluoropolymer that have a maximum size of less than 100 nanometers, the frangible fluoropolymer coating being configured to allow portions of the frangible fluoropolymer coating to shear off along interfaces of the nano-particles from a balance of the frangible fluoropolymer coating with a carbonaceous deposit under stress applied thereto by the relative motion to uncover a newly exposed face of the frangible fluoropolymer coating.

\* \* \* \* \*